(12) United States Patent  
Swoboda

(10) Patent No.: US 9,148,094 B1
(45) Date of Patent: Sep. 29, 2015

(54) OFFSET CANCELLATION IN A TRANSIMPEDANCE AMPLIFIER (TIA) CIRCUIT

(71) Applicant: Avago Technologies General IP (Singapore) Pte. Ltd., Singapore (SG)

(72) Inventor: Robert Swoboda, Vienna (AT)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/282,011

(22) Filed: May 20, 2014

(51) Int. Cl.
   *H03F 3/08* (2006.01)
   *H03F 1/02* (2006.01)

(52) U.S. Cl.
   CPC .................................. *H03F 3/08* (2013.01)

(58) Field of Classification Search
   USPC .............................................. 330/308, 9, 260
   IPC .................................................. H03F 3/08,1/02
   See application file for complete search history.

(56) References Cited

U.S. PATENT DOCUMENTS

| | | | | |
|---|---|---|---|---|
| 5,430,765 A | * | 7/1995 | Nagahori | 375/318 |
| 5,955,921 A | * | 9/1999 | Ide et al. | 330/254 |
| 6,552,605 B1 | * | 4/2003 | Yoon | 330/9 |
| 6,657,488 B1 | * | 12/2003 | King et al. | 330/9 |
| 7,015,750 B2 | | 3/2006 | Gupta | |
| 7,088,174 B2 | * | 8/2006 | Glass | 330/9 |
| 2003/0218508 A1 | * | 11/2003 | Chiou et al. | 330/308 |
| 2011/0222867 A1 | | 9/2011 | Dietz et al. | |
| 2013/0257536 A1 | * | 10/2013 | Sharma et al. | 330/259 |

OTHER PUBLICATIONS

Kyle Lafevre, Design of a Modified Cherry-Hooper Transimpedance Amplifier with DC Offset Cancellation, A Thesis Presented in Partial Fulfillment of the Requirements for the Degree Master of Science, Aug. 2011, 64 pages, Arizona State University, USA.
Ethan A. Crain, Fast Offset Compensation for 10Gbps Limit Amplifier, Submitted to the Department of Electrical Engineering and Computer Science in partial fulfillment of the requirements for the degree of Masters of Engineering in Electrical Engineering and Computer Science, May 2004, 118 pages, Massachusetts Institute of Technology, USA.

* cited by examiner

*Primary Examiner* — Patricia T Nguyen

(57) ABSTRACT

Offset measurement and cancellation circuitry is employed in a transimpedance amplifier (TIA) circuit for directly measuring the offset in the TIA input voltage and for canceling the offset from the TIA output voltage. Employing the offset measurement and cancellation circuitry eliminates the need to use large transistors in the input stage of the TIA in order to reduce or eliminate the offset, which can increase noise and reduce Rx sensitivity. The offset measurement and cancellation circuitry of the invention obviate the need of making a tradeoff between the amount of noise and the magnitude of the offset that will be tolerated. The offset measurement and cancellation circuitry also eliminate the need for additional overhead in the decision threshold in order to avoid false triggering of the decision circuitry of the optical receiver due to noise.

27 Claims, 5 Drawing Sheets

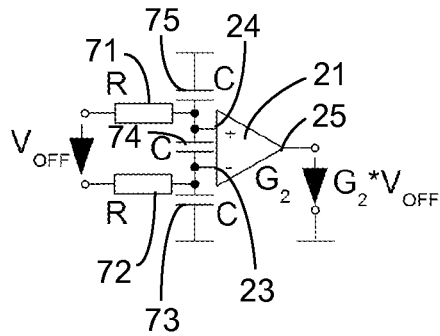
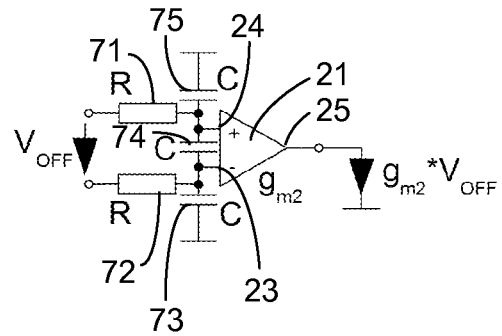
FIG. 4          FIG. 5
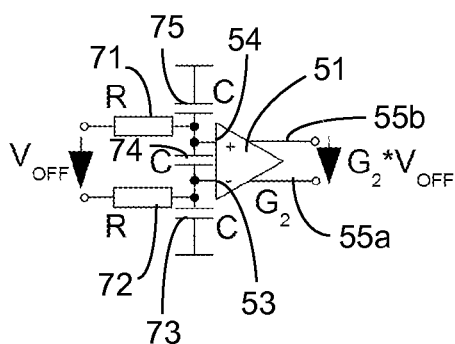
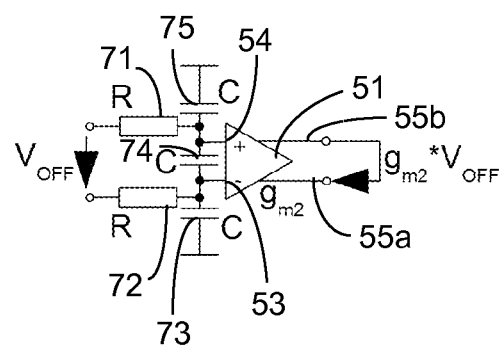
FIG. 6          FIG. 7

OFFSET CANCELLATION IN A TRANSIMPEDANCE AMPLIFIER (TIA) CIRCUIT

TECHNICAL FIELD OF THE INVENTION

The invention relates to transimpedance amplifier (TIA) circuits. More particularly, the invention relates to performing offset cancellation in a TIA circuit.

BACKGROUND OF THE INVENTION

A typical optical receiver (Rx) includes at least one photodiode that detects an optical signal and converts it into an electrical current signal and at least one transimpedance amplifier (TIA) that converts the electrical current signal into an electrical voltage signal. The photodetector, which is typically a P-intrinsic-N (PIN) photodiode, produces an electrical current signal in response to light detected by the photodetector. The TIA converts this electrical current signal into an output voltage signal having some gain, commonly referred to as transimpedance gain. This output voltage signal is further processed by other circuitry of the optical Rx (e.g., a limiting amplifier (LA), clock and data recover (CDR), etc.).

The output terminal of the photodiode is connected to the inverting input terminal of the TIA. Due to mismatch in the input stage and/or a systematic input bias voltage of the input stage, an input offset voltage is generated. The offset in the input voltage of the TIA results in an offset in the output voltage of the TIA. The common approach that is used to reduce or eliminate the offset is to use larger transistors in the input stage of the TIA. This approach, however, increases noise and therefore reduces the sensitivity of the optical Rx. Often, a tradeoff has to be made between the amount of noise that will be tolerated and the magnitude of the offset that will be tolerated. In addition, because the offset has a random nature, the offset output voltage together with noise can falsely trigger the decision circuitry of the Rx. For this reason, the decision threshold of the Rx is usually provided with some headroom to prevent noise from falsely triggering the decision circuitry of the Rx under worst case offset conditions.

In addition, applications with multi-mode or single-mode fibers may demand decreasing photodiode diameters to lower photodiode capacitances and therefore to improve sensitivity. As a result, the optimum noise figure achieved through noise matching is only possible if smaller transistors are used in the TIA. Furthermore, advancements in process technologies have also resulted in transistors having smaller gate areas, which in turn will result in even larger offsets.

Accordingly, a need exists for a way to eliminate or reduce the offset without increasing noise and/or without reducing the sensitivity of the Rx in which the TIA is employed.

SUMMARY OF THE INVENTION

The invention is directed to a TIA circuit configured to cancel out an offset in an output voltage of the TIA circuit caused by an offset voltage at an input terminal of a TIA of the TIA circuit. The TIA circuit comprises a TIA and offset measurement and cancellation (OMC) circuitry. The TIA has at least a first inverting input terminal, a first non-inverting input terminal and a first output terminal. The first inverting input terminal is electrically coupled to a first optical detector. An offset input voltage signal is present at the first inverting input terminal. The first output terminal outputs an output voltage signal that is offset due to the offset input voltage. The OMC circuitry is electrically coupled to the input and output terminals of the TIA for receiving the offset input voltage signal and the offset output voltage signal. The OMC circuitry measures the offset input voltage signal and uses the measurement to apply an offset cancellation to the offset output voltage signal that cancels the offset from the offset output voltage signal to produce an output voltage signal of the TIA circuit that is not offset.

The method comprises the following:

in a TIA of the TIA circuit having an input that is electrically coupled to an output of an optical detector, receiving an input signal at the input thereof that is offset by an offset voltage;

in the TIA, outputting an output signal from an output of the TIA, wherein the output signal of the TIA is offset by the offset voltage;

with OMC circuitry of the TIA circuit, receiving the input and output signals;

with the OMC circuitry, measuring the offset voltage of the input signal;

with the OMC circuitry, using the measurement to apply an offset cancellation to the output signal of the TIA that cancels out the offset voltage from the output signal of the TIA to produce an output voltage signal of the TIA circuit; and outputting the output voltage signal of the TIA circuit from an output of the TIA circuit. The offset voltage is not present in the output voltage signal of the TIA circuit.

These and other features of the invention will become apparent from the following description, drawings and claims.

BRIEF DESCRIPTION OF THE DRAWINGS

FIG. 4 illustrates a block diagram of the offset amplifier of the TIA circuit shown in FIG. 2 in accordance with one illustrative embodiment in which the offset amplifier is implemented as a voltage amplifier.

FIG. 5 illustrates a block diagram of the offset amplifier of the TIA circuit shown in FIG. 2 in accordance with one illustrative embodiment in which the offset amplifier is implemented as an operational transconductance amplifier.

FIG. 6 illustrates a block diagram of the offset amplifier of the TIA circuit shown in FIG. 3 in accordance with one illustrative embodiment in which the offset amplifier is implemented as a voltage amplifier.

FIG. 7 illustrates a block diagram of the offset amplifier of the TIA circuit shown in FIG. 3 in accordance with one illustrative embodiment in which the offset amplifier is implemented as an operational transconductance amplifier.

DETAILED DESCRIPTION OF AN ILLUSTRATIVE EMBODIMENT

Figure 1:
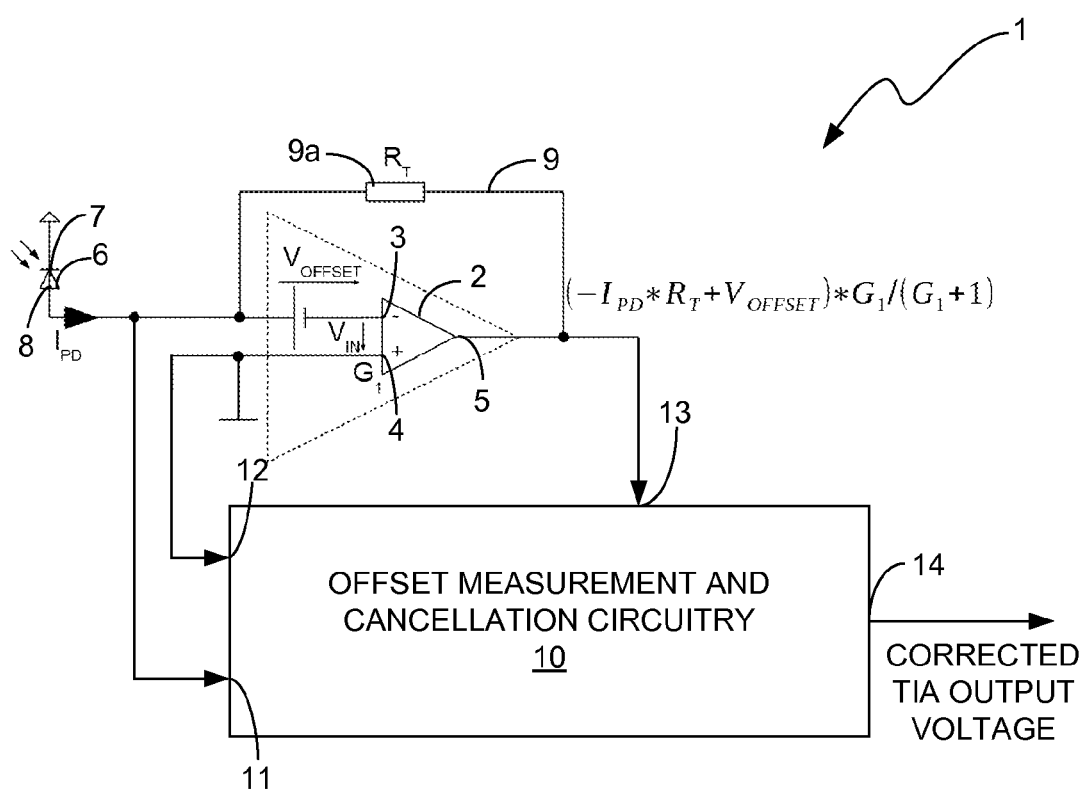
FIG. 1 illustrates a block diagram of a TIA circuit in accordance with an illustrative embodiment that performs offset cancellation.

In accordance with illustrative embodiments of the invention, offset measurement and cancellation circuitry is employed in the TIA circuit for directly measuring the offset in the TIA input voltage and for canceling the offset from the TIA output voltage. Employing the offset measurement and cancellation circuitry in the TIA circuit eliminates the need to use large transistors in the input stage of the TIA circuit in order to reduce or eliminate the offset, which, as indicated above, can increase noise and reduce Rx sensitivity. The offset measurement and cancellation circuitry also eliminates the need of making a tradeoff between the amount of noise that will be tolerated and the size of the offset that will be tolerated. The offset measurement and cancellation circuitry also eliminate the overhead in the decision threshold to avoid false triggering of the decision circuitry of the Rx due to noise. A few illustrative embodiments of the offset measurement and cancellation circuitry and method will now be described with reference to the FIGS. 1-8, in which like reference numerals represent like elements, features or components.

FIG. 1 illustrates a block diagram of a TIA circuit 1 in accordance with an illustrative embodiment. The TIA circuit 1 includes a TIA 2, which is typically, but not necessarily, an operational amplifier (Op Amp), and offset measurement and cancellation (OMC) circuitry 10. The TIA 2 has an inverting terminal 3, a noninverting terminal 4, and an output terminal 5. A photodiode 6, which is not part of the TIA circuit 1, has a first terminal 7 that is electrically coupled to electrical ground and a second terminal 8 that is electrically coupled to the inverting terminal 3 of the TIA 2. A feedback path 9 exists between the output terminal 5 of the TIA 2 and the inverting input terminal 3 of the TIA 2. A feedback resistor 9a is connected in line in the feedback path 9 in between the inverting terminal 3 and the output terminal 5 of the TIA 2.

The OMC circuitry 10 has first and second input terminals 11 and 12 that are electrically coupled to the inverting and noninverting terminals 3 and 4, respectively, of the TIA 2. Terminal 11 of the OMC circuitry 10 is also electrically coupled to the second terminal 8 of the photodiode 6. A third input terminal 13 of the OMC circuitry 10 is electrically to the output terminal 5 of the TIA 2. The OMC circuitry 10 has an output terminal 14 that is the output of the TIA circuit 1.

The OMC circuitry 10 directly measures the offset in the input voltage of the TIA 2. As indicated above, in a conventional TIA circuit, the offset in the input voltage results in an offset in the output voltage of the TIA circuit. Likewise, the output voltage of the TIA 2 that is output from the output terminal 5 is also offset due to the offset in the input voltage. The OMC circuitry 10 subtracts the measured offset from the output voltage of the TIA 2 to cancel out the offset and thereby produce a corrected output voltage. The corrected output voltage of the TIA circuit 1 is then output from the output terminal 14 of the OMC circuitry 10. The corrected output voltage of the OMC circuitry 10 is the output voltage of the TIA circuit 1 with the offset canceled, or removed.

The OMC circuitry 10 can have a variety of configurations. A few illustrative embodiments of suitable configurations of the OMC circuitry 10 will now be described with reference to FIGS. 2 and 3. However, it will be understood by those of skill in the art, in view of the description being provided herein, that the invention is not limited to the configurations being described herein.

Figure 2:
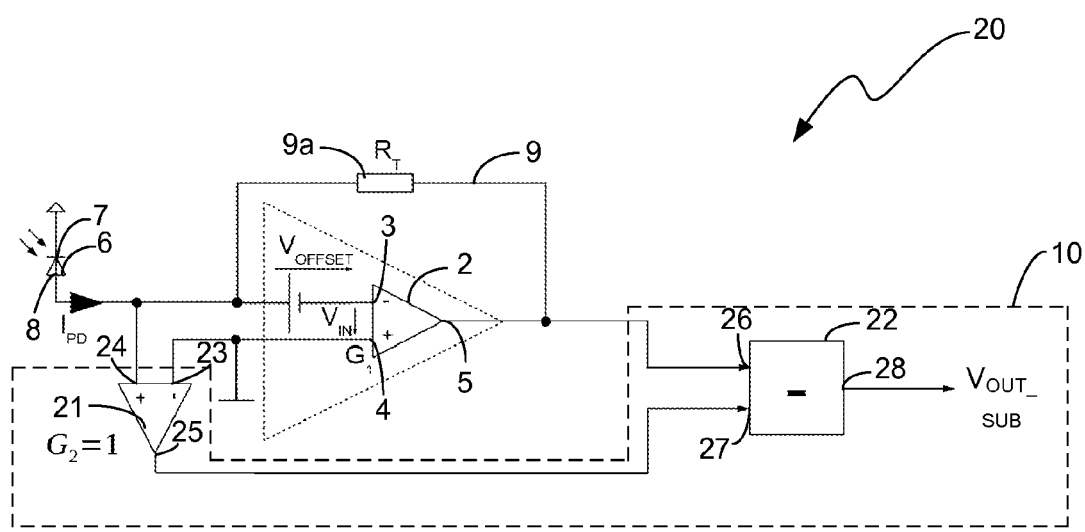
FIG. 2 illustrates a block diagram of a TIA circuit in accordance with another illustrative embodiment having a single-ended configuration that performs offset cancellation.

FIG. 2 illustrates a block diagram of a TIA circuit 20 in accordance with another illustrative embodiment having a single-ended configuration. The TIA circuit 20 includes the TIA 2 and the OMC circuitry 10 shown in FIG. 1. The OMC circuitry 10 is the portion of the TIA circuit 20 that is contained within the dashed box labeled with reference numeral 10. In accordance with this illustrative embodiment, the OMC circuitry 10 includes an offset amplifier 21 and a subtractor 22. The offset amplifier 21 has an inverting input terminal 23, a noninverting input terminal 24 and an output terminal 25. The noninverting and inverting terminals 24 and 23, respectively, of the offset amplifier 21 are electrically coupled to the inverting and noninverting terminals 3 and 4, respectively, of the TIA 2. The noninverting input terminal 4 of TIA 2 and the inverting input terminal 23 of offset amplifier 21 are electrically coupled to ground, either directly or via an AC coupling capacitor. The noninverting terminal 24 of the offset amplifier 21 is also electrically coupled to the output terminal 8 of the photodiode 6. The subtractor 22 is connected to the output terminals 5 and 25 of the TIA 2 and offset amplifier 21, respectively.

In accordance with this embodiment, the amplifier 21 has a unity gain, $G_2$, (i.e., $G_2$ is equal to 1). To overcome the unwanted influence of the offset input voltage of the TIA circuit 20, the amplifier 21 measures the offset and outputs an offset input voltage at output terminal 25 of the amplifier 21. The subtractor 22 receives the offset input voltage output from amplifier 21 and the offset output voltage output from output terminal 5 of TIA 2 and subtracts the offset input voltage from the offset output voltage to produce a corrected output voltage. Thus, the subtractor 22 cancels out the offset from the output voltage of amplifier 2 and outputs the corrected output voltage from output terminal 28 of the subtractor 22.

It should be noted that there may be cases in which the offset amplifier 21 has a negative gain. In such cases, the subtractor 22 will instead be an adder that adds the negative-gain offset input voltage output from the offset amplifier 21 to the offset output voltage output from the output terminal of TIA 2. The term "subtractor," as that term is used herein, is intended to denote a component that performs a subtraction operation when the signals being operated on thereby have a positive gain and to denote a component that performs an addition operation when one of the signals being operated on thereby has a positive gain and the other signal being operated on thereby has a negative gain.

The output voltage of the TIA 2, $V_{OUT\_TIA}$, can be mathematically expressed as: $V_{OUT\_TIA}=(-I_{PD}*R_T+V_{OFFSET})*G_1/(G_1+1)$, where $I_{PD}$ is the electrical current signal generated by the photodiode 6, $R_T$ is the resistance of the feedback resistor 9a, and $V_{OFFSET}$ is the input offset voltage received at the inverting input terminal 3 of the TIA 2. The output voltage of the offset amplifier 21, $V_{OUT\_OFFSET\_AMP}$, can be mathematically expressed as: $V_{OUT\_OFFSET\_AMP}=V_{OFFSET}*G_1/(G_1+1)*G_2$. In cases where the gain $G_2$ is other than unity, the subtractor 22 includes attenuation circuitry (not shown) at the port corresponding to input terminal 27 that essentially multiples $V_{OUT\_OFFSET\_AMP}$ by $1/G_2$ to remove the gain $G_2$ from $V_{OUT\_OFFSET\_AMP}$. The attenuation circuitry may be implemented in a number of manners and the manner in which it is implemented will depend on the manner in which the subtractor 22 is implemented. For example, in the case where the subtractor 22 is configured to perform a voltage-to-current conversion and then take the difference between the currents, the attenuation may be accomplished via the resistance of one or more resistors or via the transconductance of one or more transistors. In that case, the desired amount of attenuation is achieved by simply selecting the appropriate value of the resistors or the appropriate biasing current of the transistors.

The subtractor 22 includes difference circuitry (not shown) that then takes the difference between the output (or attenuated output if $G_2$ is greater than unity) of the offset amplifier 21, $V_{OFFSET}*G_1/(G_1+1)$, and the output of the TIA 2 to produce the output of the subtractor 22, $V_{OUT\_SUB}$, which can be mathematically expressed as: $V_{OUT\_SUB}=(-I_{PD}*R_T+$ $V_{OFFSET})*G_1/(G_1+1)-V_{OFFSET}*G_1/(G_1+1)=-I_{PD}*R_T*G_1/(G_1+1)$. Thus, it can be seen mathematically that the influence of $V_{OFFSET}$ has been removed from the output of the subtractor 22, which corresponds to the corrected TIA output voltage.

With high gain TIAs (i.e., $G_1 \gg 1$), the input voltage of the TIA remains nearly constant and equal to the input offset voltage. The TIA circuit 20 makes use of this principle to measure the offset input voltage with the offset amplifier 21. The offset amplifier 21 should be configured to be relatively slow with very low offset. This can be accomplished by using, for example, large transistors with good matching or chopper stabilized amplifiers in the offset amplifier 21. To avoid an increase in the noise of the TIA circuit 20, relatively large resistors can be used to decouple the offset amplifier 21 from the signal path. In other words, one or more large resistors can be inserted into the signal path that extends between the second terminal 8 of the photodiode 6 and the noninverting input terminal 24 of the offset amplifier 21. Using slow elements in the offset path may introduce small, slow tails, but they will have no influence on the overall system performance provided that a slower decaying adaptive threshold generation scheme is used in the optical Rx for generating the decision thresholds.

Figure 3:
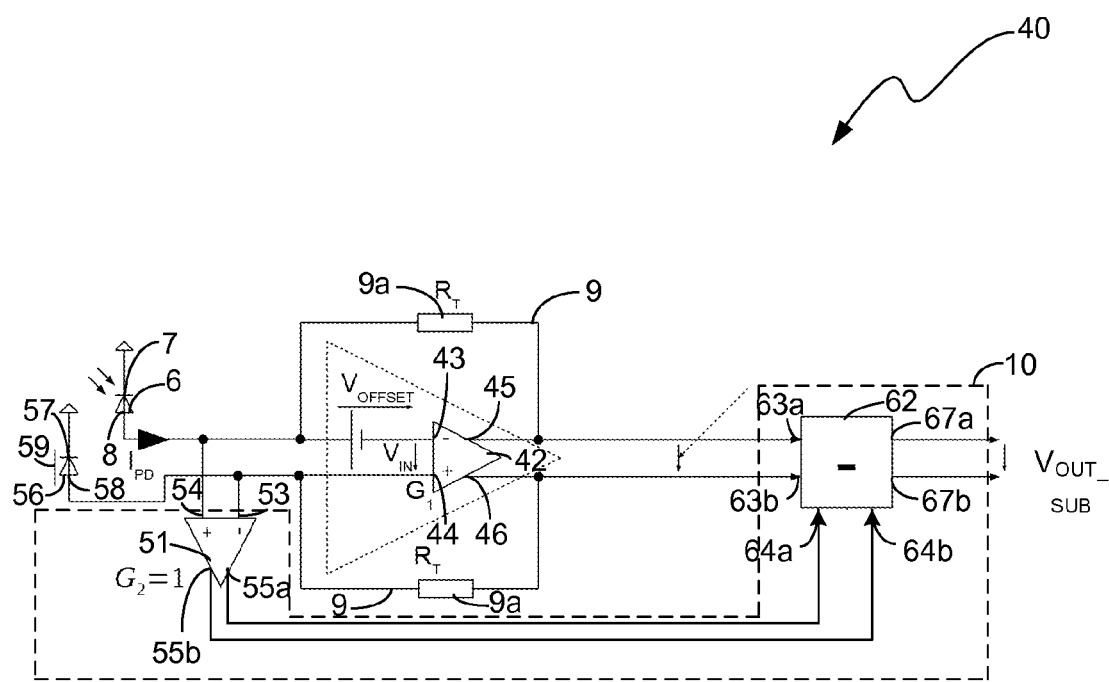
FIG. 3 illustrates a block diagram of a TIA circuit in accordance with another illustrative embodiment having a fully-differential configuration that performs offset cancellation.

The same method of offset cancellation that has been described above with reference to FIGS. 1 and 2 is also possible in a full differential TIA circuit configuration, as will now be described with reference to FIG. 3. FIG. 3 illustrates a block diagram of a TIA circuit 40 in accordance with another illustrative embodiment having a fully-differential configuration. The TIA circuit 40 includes a differential TIA 42 and the offset measurement and cancellation circuitry 10 shown in FIG. 1. The differential TIA 42 includes an inverting input terminal 43, a noninverting input terminal 44, a first output terminal 45, and a second output terminal 46. The OMC 10 is contained within the dashed box labeled with reference numeral 10. In accordance with this illustrative embodiment, the OMC circuitry 10 includes a differential offset amplifier 51 and a differential subtractor 62. The differential offset amplifier 51 has an inverting input terminal 53, a noninverting input terminal 54 and output terminals 55a and 55b. The noninverting and inverting terminals 54 and 53, respectively, of the differential offset amplifier 51 are electrically coupled to the inverting and noninverting terminals 43 and 44, respectively, of the differential TIA 42. The noninverting input terminal 54 of the differential offset amplifier 51 is also electrically coupled to the second terminal 8 of the photodiode 6.

The inverting input terminal 53 of the differential offset amplifier 51 and the noninverting input terminal 44 of the differential TIA 42 are electrically coupled to a second terminal 58 of a dummy photodiode 56 that matches the characteristics of the photodiode 6. A first terminal 57 of the dummy photodiode 56 is electrically coupled to ground potential. The dummy photodiode 56 is shielded by a shield 59 to prevent light of the active wavelength of the dummy photodiode 56 from impinging thereon. The dummy photodiode 59 provides a reference current and impedance that the TIA 42 and the differential offset amplifier 51 use in performing their respective differential operations. The manner in which a dummy photodiode may be used for this purpose is well known and therefore will not be described herein in further detail. Also, although the optical detector is being described herein as being a photodiode, other types of optical detectors that convert optical energy into electrical energy may be used for this purpose. Also, the dummy photodiode may be an unshielded dummy photodiode, and in some applications multiple unshielded dummy photodiodes may be used, such as in a case where two unshielded dummy photodiodes are used to detect respective optical signals passing out of the ends of two optical fibers or out of two light paths of an interferometer.

The differential subtractor 62 (or adder if one of the signals being operated on has a negative gain) has input terminal 63a and 63b that are electrically coupled to the output terminals 45 and 46, respectively, of the differential TIA 42 and has input terminals 64a and 64b that are electrically coupled to the output terminals 55a and 55b, respectively, of the offset differential amplifier 51. In accordance with this embodiment, the differential offset amplifier 51 has a gain, $G_2$, that is equal to unity (i.e., equal to 1). The differential offset amplifier 51 measures the differential offset and outputs a differential offset output voltage at output terminals 55a and 55b of the amplifier 51. The differential subtractor 62 receives the differential offset output voltage output from amplifier 51 and the differential offset output voltage output from output terminals 45 and 46 of differential TIA 42. The differential subtractor 62 subtracts the differential offset output voltage output from amplifier 51 from the differential offset output voltage output from TIA 42 to produce a corrected differential output voltage, $V_{OUT}$, which is output at the output terminals 67a and 67b of the differential subtractor 62. The corrected differential output voltage $V_{OUT}$ does not include the offset. In this way, the offset is canceled out of the differential output voltage that is output from differential TIA 42. As indicated above, if the differential offset output voltage output from amplifier 51 has a negative gain, the differential subtractor 62 would instead be a differential adder.

The differential output voltage of the TIA circuit 40, $V_{OUT\_DIFF\_TIA}$, can be mathematically expressed as: $V_{OUT\_DIFF\_TIA}=(-I_{PD}*R_T+V_{OFFSET})*G_1/(G_1+1)$, which is the same as provided above for the single-ended case of FIG. 2. The output voltage of the offset differential amplifier 51, $V_{OUT\_OFFSET\_AMP}$, can be mathematically expressed as: $V_{OUT\_OFFSET\_AMP}=V_{OFFSET}*G_1/(G_1+1)*G_2$. If $G_2$ is greater than unity, then the differential subtractor 62 will attenuate $V_{OUT\_OFFSET\_AMP}$ by $1/G_2$ before performing the differencing operation. The output of the differential subtractor 62, $V_{OUT\_SUB}$, is obtained by taking the difference between the output of the differential TIA 42 and the output of the offset differential amplifier 51, which can be mathematically expressed as: $V_{OUT}=(-I_{PD}*R_T+V_{OFFSET})*G_1/(G_1+1) V_{OFFSET}*G_1/(G_1+1)=-I_{PD}*R_T*G_1/(G_1+1)$. Thus, it can be seen mathematically that $V_{OFFSET}$ has no influence on the output of the subtractor 62, which corresponds to the corrected TIA output voltage.

The offset amplifier 21 shown in FIG. 2 may be implemented in different ways. FIG. 4 illustrates a block diagram of the offset amplifier 21 in accordance with one illustrative embodiment in which the offset amplifier 21 is implemented as a voltage amplifier. In accordance with this embodiment, a resistor capacitor (RC) network comprising resistors 71 and 72 and capacitors 73, 74 and 75 electrically couples the input terminals 23 and 24 of the offset amplifier 21 to the input terminals 3 and 4 of the TIA 2 and to the terminal 8 of the photodiode 6. The RC network helps decouple the offset amplifier 21 from other portions of the TIA circuit 20 and provides filtering to prevent the offset amplifier 21 from increasing noise in the TIA circuit 20. It should be noted that the RC network is optional and can be omitted if the offset amplifier 21 does not produce a large amount of noise. The output of the offset amplifier 21 is a voltage equal to $G_2*V_{OFF}$, where $V_{OFF}$ is the input offset voltage of the offset amplifier 21 and $G_2$ is the gain of the offset amplifier 21.

FIG. 5 illustrates a block diagram of the offset amplifier 21 in accordance with another illustrative embodiment in which the amplifier 21 is implemented as an operational transconductance amplifier (OTA). This embodiment also includes the optional RC network shown in FIG. 4 comprising resistors 71 and 72 and capacitors 73, 74 and 75 for decoupling the offset amplifier 21 from other portions of the TIA circuit 20 and providing filtering to prevent the offset amplifier 21 from increasing noise in the TIA circuit 20. The output of the offset amplifier 21 is an electrical current having a current value equal to $g_{m2}*V_{OFF}$, where $V_{OFF}$ is the input offset voltage received at the input terminals 23 and 24 of the amplifier 21 and $g_{m2}$ is the transconductance of the amplifier 21. Because, the product of $g_{m2}*V_{OFF}$ is an electrical current value that is provided to the subtractor 22, the input port of the subtractor 22 at input terminal 27 needs to be a current interface. In this case, the current interface may be a simple resistor (not shown) with a resistance value equal to $1/g_{m2}$.

FIGS. 6 and 7 illustrate block diagrams of different illustrative embodiments for the differential offset amplifier 51 shown in FIG. 3. FIG. 6 illustrates a block diagram of the differential offset amplifier 51 implemented as a voltage amplifier. Again, these embodiments include the optional RC network comprising resistors 71 and 72 and capacitors 73, 74 and 75 for decoupling the differential offset amplifier 51 from other portions of the TIA circuit 40 and for providing noise filtering. The output of the differential offset amplifier 51 is a differential voltage signal equal to $G_2*V_{OFF}$, where $V_{OFF}$ is the differential input offset voltage of the offset amplifier 51 and $G_2$ is the gain of the differential offset amplifier 51. As indicated above, if the gain $G_2$ is other than unity, the output signal of the differential offset amplifier 51 will be attenuated by $1/G_2$ at the corresponding input port of the differential subtractor 62 before the subtraction operations are performed by the differential subtractor 62. Of course, the attenuation operation could also be performed by some other attenuation element disposed in the electrical pathway in between the output terminals 55a and 55b of the amplifier 51 and the input terminals 64a and 64b of the subtractor 62.

FIG. 7 illustrates a block diagram of the differential offset amplifier 51 implemented as an OTA. The differential output of the differential OTA 51 is a differential electrical current having a differential current value equal to $g_{m2}*V_{OFF}$, where $V_{OFF}$ is the differential input offset voltage received at the input terminals 53 and 54 of the amplifier 51 and $g_{m2}$ is the transconductance of the OTA 51. Because, the product of $g_{m2}*V_{OFF}$ is a differential electrical current value that is provided to the subtractor 62, the input port of the subtractor 62 at input terminals 64a and 64b needs to be a current interface, which, as indicated above, may be a simple resistor (not shown) with a resistance value equal to $1/g_{m2}$. Of course, the element that performs the $1/gm_2$ operation could instead be interposed between the output of the differential offset amplifier 51 and the input of the differential subtractor 62.

Figure 8:
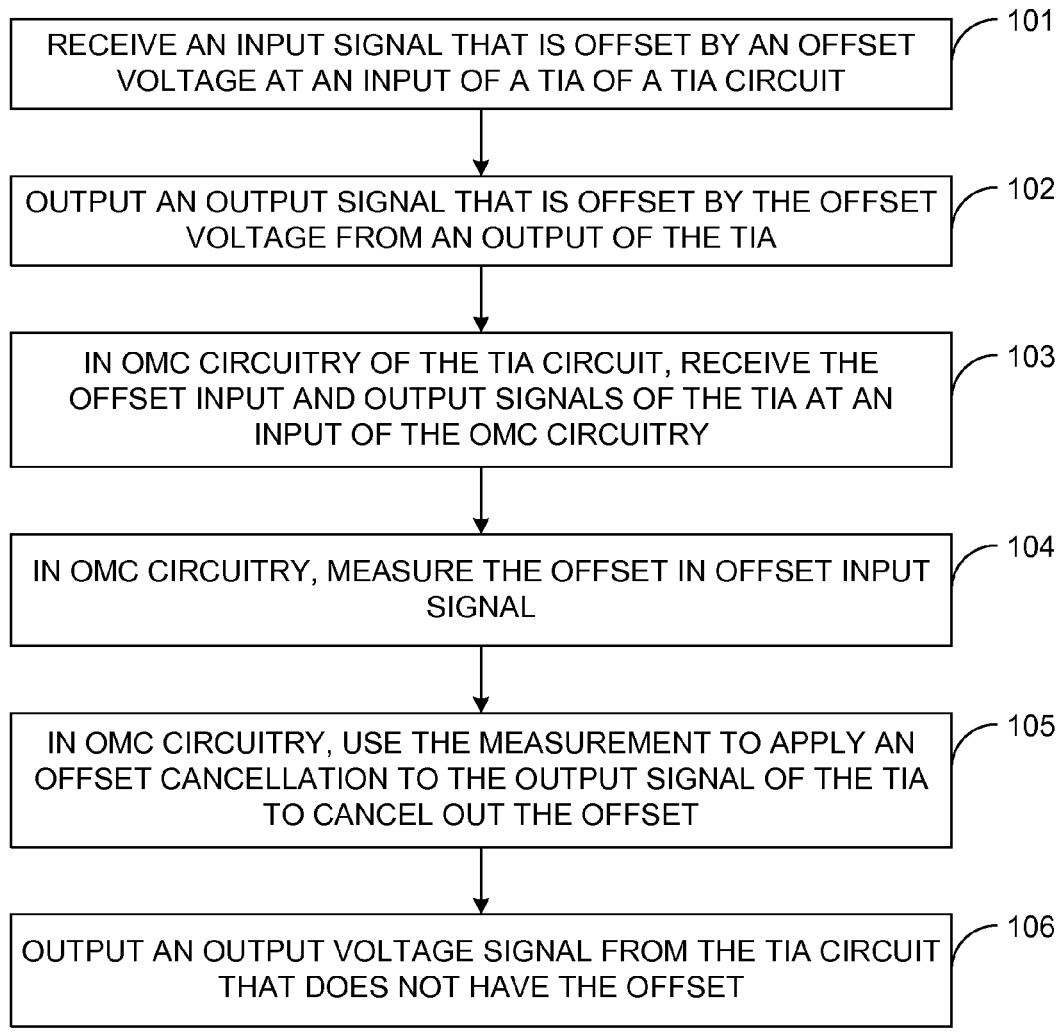
FIG. 8 illustrates a flowchart that represents the method in accordance with an illustrative embodiment for performing offset cancellation in a TIA circuit of an optical Rx.

FIG. 8 illustrates a flowchart that represents the method in accordance with an illustrative embodiment for performing offset cancellation in a TIA circuit of an optical Rx. The method in accordance with an illustrative embodiment is as follows. In a TIA of the TIA circuit having an input that is electrically coupled to an output of an optical detector, an input signal that is offset by an offset voltage is received at the input thereof, as indicated by block 101. The TIA then outputs an output signal that is offset by the offset voltage from an output of the TIA, as indicated by block 102. OMC circuitry of the TIA circuit receives the input and output signals, as indicated by block 103. The OMC circuitry measures the offset voltage of the input signal, as indicated by block 104.

The OMC circuitry then uses the measurement to apply an offset cancellation to the output signal of the TIA that cancels out the offset voltage from the output signal of the TIA to produce an output voltage signal of the TIA circuit, as indicated by block 105. The OMC circuitry then outputs the output voltage signal of the TIA circuit from an output of the TIA circuit, as indicated by block 106. The offset voltage is not present in the output voltage signal of the TIA circuit.

It should be noted that although the illustrative embodiments have been described with reference to an optical Rx, the principles and concepts of the invention may also be applied to an electrical Rx. In such cases, the photodiode is replaced by some other type of detector (not shown) that converts some other type of input signal into an electrical detection signal. Persons of skill in the art will understand how the principles and concepts of the invention can be applied in such non-optical environments. It should also be noted that the circuits and method described above with reference to FIGS. 1-8 are merely examples of suitable configurations or methods that demonstrate the principles and concepts of the invention. As will be understood by those skilled in the art in view of the description being provided herein, many modifications may be made to the embodiments described herein without deviating from the goals of the invention, and all such modifications are within the scope of the invention.

What is claimed is:

1. A transimpedance amplifier (TIA) circuit configured to cancel out an offset in an output voltage of the TIA circuit caused by an offset voltage at an input terminal of a TIA of the TIA circuit, the TIA circuit comprising:
   a TIA having at least a first inverting input terminal, a first non-inverting input terminal and a first output terminal, the first inverting input terminal being electrically coupled to a first optical detector, wherein an offset input voltage signal is present at the first inverting input terminal and wherein the first output terminal outputs an output voltage signal that is offset due to the offset input voltage; and
   offset measurement and cancellation (OMC) circuitry, the OMC being electrically coupled to the input and output terminals of the TIA for receiving the offset input voltage signal and the offset output voltage signal, wherein the OMC circuitry measures the offset input voltage signal and uses the measurement to apply an offset cancellation to the offset output voltage signal that cancels the offset from the offset output voltage signal to produce an output voltage signal of the TIA circuit that is not offset.

2. The TIA circuit of claim 1, wherein the OMC circuit comprises:
   at least a first offset amplifier having at least a first inverting input terminal, a first non-inverting input terminal and a first output terminal, the first non-inverting input terminal of the first offset amplifier being electrically coupled to the first inverting input terminal of the TIA and receiving the offset input voltage signal, the first inverting input terminal of the first offset amplifier being electrically coupled to the first non-inverting input terminal of the TIA stage; and
   a subtractor having at least first and second input terminals and an output terminal, the first output terminals of the TIA and of the first offset amplifier being electrically coupled to the first and second input terminals of the subtractor, respectively, the subtractor subtracting an output voltage signal output from the first output terminal of the first offset amplifier from the offset output voltage signal output from the first output terminal of the TIA to produce said output voltage signal of the TIA circuit from which the offset has been removed.

3. The TIA circuit of claim 2, wherein the TIA circuit is part of an optical receiver that receives an optical signal passing out of an end of an optical fiber, and wherein the optical detector is a photodiode that converts the received optical signal into an electrical current signal, and wherein the electrical current signal is applied to the first inverting input terminal of the TIA.

4. The TIA circuit of claim 2, wherein the first non-inverting input terminal of the TIA and the first inverting input terminal of the first offset amplifier are electrically coupled to a ground potential.

5. The TIA circuit of claim 4, further comprising:
a first feedback path having at least a first feedback resistor, the first feedback path having a first end that is electrically coupled to the first output terminal and having a second end that is electrically coupled to the first inverting input terminal.

6. The TIA circuit of claim 5, wherein the TIA is a differential TIA, and wherein the differential TIA has first and second output terminals, and wherein the subtractor is a differential subtractor that has a third input terminal and a second output terminal, the TIA circuit further comprising:
a second feedback path having at least a second feedback resistor, the second feedback path having a first end that is electrically coupled to the second output terminal of the differential TIA and having a second end that is electrically coupled to the first non-inverting input terminal of the differential TIA, and wherein the first inverting input terminal of the first offset amplifier and the first non-inverting input terminal of the differential TIA are electrically coupled to an output terminal of a dummy optical detector having characteristics that mirror characteristics of the first optical detector, and wherein the third input terminal of the subtractor is electrically coupled to the second output terminal of the differential TIA, and wherein a differential offset output voltage signal is output from the first and second output terminals of the TIA, and wherein the differential subtractor subtracts the output voltage output from the first output terminal of the first differential offset amplifier from the differential offset output voltage output from the first and second output terminals of the TIA to remove the voltage offset from the differential offset output voltage to produce the output signal of the TIA circuit.

7. The TIA circuit of claim 5, wherein the first offset amplifier is a voltage amplifier.

8. The TIA circuit of claim 5, wherein the first offset amplifier is a transconductance amplifier.

9. The TIA circuit of claim 2, wherein the TIA has a first gain, $G_1$, and wherein the first offset amplifier has a second gain, $G_2$.

10. The TIA circuit of claim 9, wherein $G_2$ is equal to 1.

11. The TIA circuit of claim 9, wherein $G_1$ and $G_2$ are greater than 1.

12. The TIA circuit of claim 10, wherein $G_1$ is greater than 1.

13. The TIA circuit of claim 10, wherein $G_1$ is much greater than 1.

14. The TIA circuit of claim 9, wherein $G_2$ is a negative gain.

15. A method for use in a transimpedance amplifier (TIA) circuit for cancelling out an offset in an output voltage of the TIA circuit caused by an offset voltage at an input terminal of a TIA of the TIA circuit, the method comprising:
in a TIA of the TIA circuit having an input that is electrically coupled to an output of an optical detector, receiving an input signal at the input thereof that is offset by an offset voltage;
in the TIA, outputting an output signal from an output of the TIA, wherein the output signal of the TIA is offset by the offset voltage;
with offset measurement and cancellation (OMC) circuitry of the TIA circuit, receiving the input and output signals;
with the OMC circuitry, measuring the offset voltage of the input signal;
with the OMC circuitry, using the measurement to apply an offset cancellation to the output signal of the TIA that cancels out the offset voltage from the output signal of the TIA to produce an output voltage signal of the TIA circuit; and
outputting the output voltage signal of the TIA circuit from an output of the TIA circuit, wherein the offset voltage is not present in the output voltage signal of the TIA circuit.

16. The method of claim 15, wherein the method is performed in an optical receiver that incorporates the TIA circuit.

17. The method of claim 15, wherein the step of measuring the offset voltage includes:
with at least a first offset amplifier of the TIA circuit, receiving the input signal of the TIA at an input of the first offset amplifier and outputting an output signal from an output of the first offset amplifier, wherein the output signal of the offset amplifier includes the offset;
with a subtractor receiving the output signal of the first offset amplifier and receiving the offset output voltage signal that is outputted from the TIA; and
with the subtractor, subtracting the output signal that of the first offset amplifier from the offset output voltage signal that is outputted from the TIA to produce the TIA circuit output voltage signal in which the offset voltage is not present.

18. The method of claim 17, wherein the TIA circuit is part of an optical receiver that receives an optical signal passing out of an end of an optical fiber, and wherein the optical detector is a photodiode that converts the received optical signal into an electrical current signal, and wherein the electrical current signal is the input signal of the TIA.

19. The method of claim 17, wherein the first offset amplifier is a voltage amplifier.

20. The method of claim 17, wherein the first offset amplifier is a transconductance amplifier.

21. The method of claim 17, wherein the TIA has a first gain, $G_1$, and wherein the first offset amplifier has a second gain, $G_2$.

22. The method of claim 21, wherein $G_2$ is equal to 1.

23. The method of claim 21, wherein $G_1$ and $G_2$ are greater than 1.

24. The method of claim 22, wherein $G_1$ is greater than 1.

25. The method of claim 21, wherein $G_1$ is much greater than 1.

26. The method of claim 21, wherein $G_2$ is a negative gain.

27. A transimpedance amplifier (TIA) circuit configured to cancel out an offset in an output voltage of the TIA circuit caused by an offset voltage at an input terminal of a TIA of the TIA circuit, the TIA circuit comprising:
a TIA having at least a first inverting input terminal, a first non-inverting input terminal and a first output terminal, the first inverting input terminal being electrically coupled to a first optical detector, wherein an offset input voltage signal is present at the first inverting input terminal and wherein the first output terminal outputs an output voltage signal that is offset due to the offset input voltage;

at least a first offset amplifier having at least a first inverting input terminal, a first non-inverting input terminal and a first output terminal, the first non-inverting input terminal of the first offset amplifier being electrically coupled to the first inverting input terminal of the TIA and receiving the offset input voltage signal, the first inverting input terminal of the first offset amplifier being electrically coupled to the first non-inverting input terminal of the TIA stage; and a subtractor having at least first and second input terminals and an output terminal, the first output terminals of the TIA and of the first offset amplifier being electrically coupled to the first and second input terminals of the subtractor, respectively, the subtractor subtracting an output voltage signal output from the first output terminal of the first offset amplifier from the offset output voltage signal output from the first output terminal of the TIA to produce an output voltage signal of the TIA circuit that does not include the offset.

* * * * *